United States Patent [19]
Korinsky

[11] Patent Number: 5,258,888
[45] Date of Patent: Nov. 2, 1993

[54] THERMAL PACKAGING FOR NATURAL CONVECTION COOLED ELECTRONICS

[75] Inventor: George K. Korinsky, Woodlands, Tex.

[73] Assignee: Compaq Computer Corporation, Houston, Tex.

[21] Appl. No.: 998,783

[22] Filed: Dec. 28, 1992

Related U.S. Application Data

[63] Continuation-in-part of Ser. No. 670,347, Mar. 15, 1991, Pat. No. 5,185,691.

[51] Int. Cl.⁵ .................................................. H05K 7/20
[52] U.S. Cl. .................................. 361/704; 361/702; 361/690; 361/730
[58] Field of Search ................. 307/150; 361/383–384, 361/386–389, 392, 394, 395, 399, 141, 144

[56] References Cited

U.S. PATENT DOCUMENTS

| | | | |
|---|---|---|---|
| 3,462,553 | 8/1969 | Spranger | 361/383 |
| 3,857,044 | 12/1974 | Papoi et al. | 361/383 |
| 3,934,177 | 1/1976 | Horbach | 361/388 |
| 4,471,407 | 9/1984 | Sleder | 361/387 |
| 4,528,615 | 7/1985 | Perry | 361/387 |
| 4,639,836 | 1/1987 | Mayer | 361/383 |
| 4,872,102 | 10/1989 | Getter | 361/383 |
| 4,879,632 | 11/1989 | Yamamoto et al. | 361/386 |
| 5,031,072 | 7/1991 | Malhi et al. | 361/387 |
| 5,060,114 | 10/1991 | Feinberg et al. | 361/387 |

FOREIGN PATENT DOCUMENTS

| | | | |
|---|---|---|---|
| 0152254 | 11/1981 | Japan | 361/383 |
| 2052164 | 1/1981 | United Kingdom | 361/383 |

Primary Examiner—Gregory D. Thompson
Attorney, Agent, or Firm—Pravel, Hewitt, Kimball & Krieger

[57] ABSTRACT

A natural convection cooled electronic device utilizing a box-like plastic enclosure surrounding the circuitry of the electronic device. The apparatus further includes aluminum heat sinks fastened in good thermal contact with heat dissipating components of the electronic device, wherein the heat sinks include heat fin members which run parallel to the inner walls of the enclosure and are separated from the walls by an air gap. The inner walls of the enclosure are lined with a layer of thermally conductive material, such as copper foil, which spreads the internal heat flux across the total surface area of the enclosure. The exposed surface of the heat flux spreader layer and the facing surface of the heat fin members are further made semi-rough and stained black to eliminate potential hot spots and to increase radiant heat transfer between the heat sinks and the enclosure. An alternative embodiment includes an electrical insulation layer between the electronic circuitry and the heat flux spreader layer. The insulation layer may include openings to allow contact of the heat flux spreader layer to the electronic circuitry at grounded locations.

24 Claims, 4 Drawing Sheets

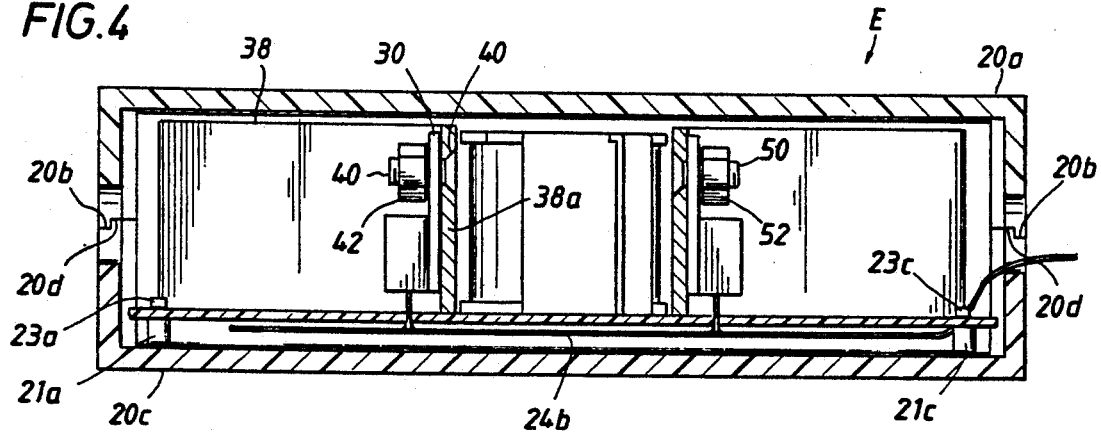
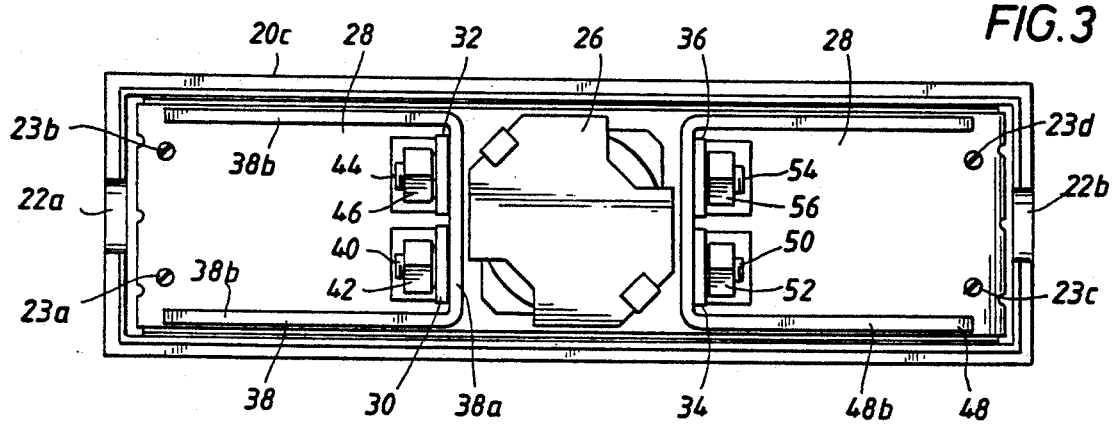
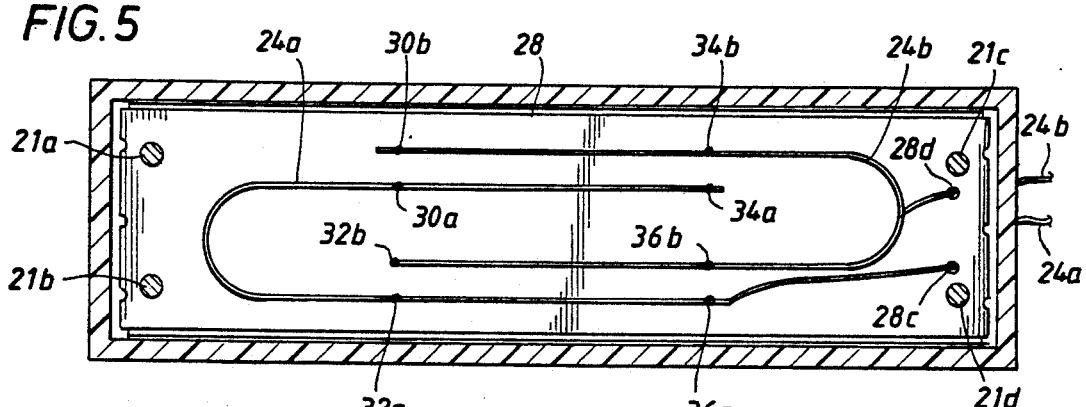
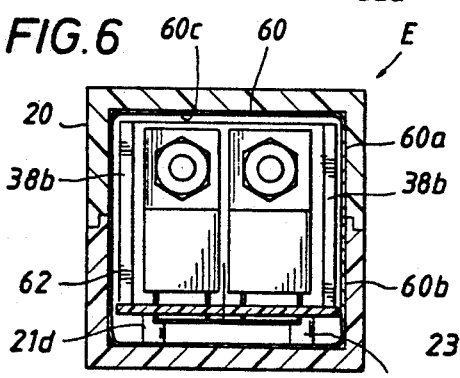

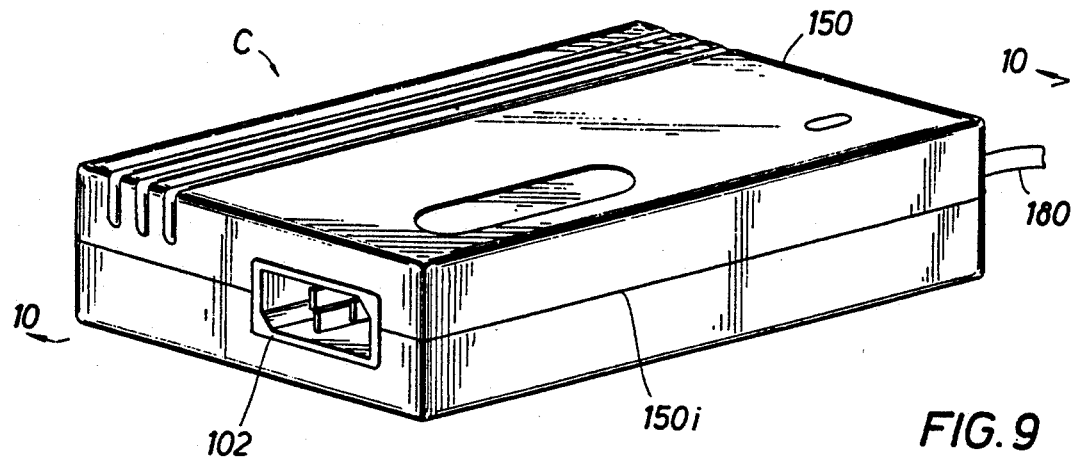
FIG. 9
FIG. 10
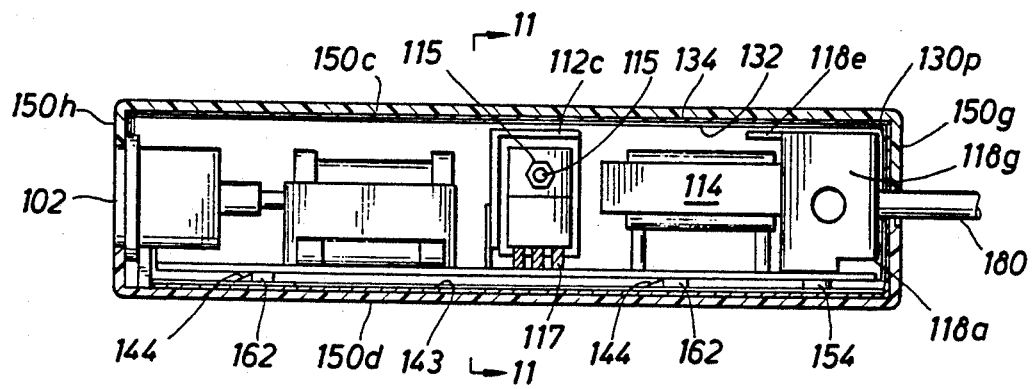
FIG. 11
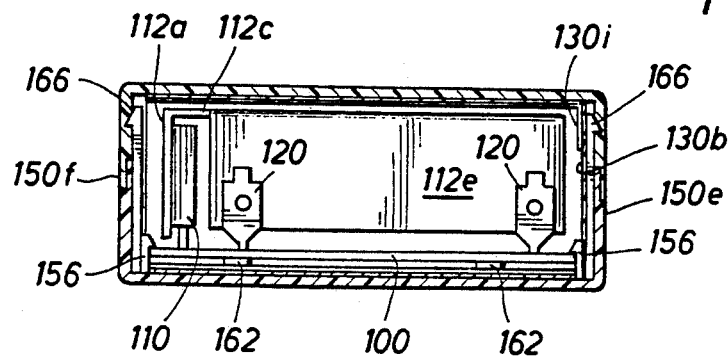

THERMAL PACKAGING FOR NATURAL CONVECTION COOLED ELECTRONICS

This is a continuation-in-part of co-pending application Ser. No. 670,347, filed Mar. 15, 1991 U.S. Pat. No. 5,185,691.

BACKGROUND OF THE INVENTION

1. Field of the Invention

The present invention relates to thermal packaging for natural convection cooled electronics.

2. Description of Prior Art

Power converters are necessary to convert readily available forms of power, such as power from an ac outlet or from a battery, to regulated power required by many electronic devices including laptop computers. Some of the power during the power conversion process is inevitably converted to thermal energy which must be dissipated at a high enough rate to prevent excessive heat build up and product failure. The packaging used to contain the power converter usually includes the means to diffuse the extraneous thermal energy, otherwise known as the dissipated power.

Thermal requirements have been established within the electronic industry world-wide by various agencies such as Canadian Standards Agency (CSA), Underwriter's Laboratories (UL) and Technischer Überwachungs-Verein (TÜV) which define tolerable thermal limits that allow safe product operation. These thermal limits are usually in the form of allowable temperature increases from the device maximum specified operating ambient air temperature as well as maximum temperature limits. One applicable and particularly stringent standard is UL 1950, sections 1.4.7, 1.4.8, and 5.1, which specifies, among other things, proper thermal test procedures and allowable temperature rises from ambient.

The demands of the computer market require that the power converter for a laptop computer be designed as small and lightweight as possible. The size and weight of the converter, however, depends not only on elements of the converter itself but also on the allowable dissipative power density of the packaging. It is desirable, therefore, to increase the allowable dissipated power density of the packaging as much as possible without increasing its weight or cost significantly. Ultimately, this allows the size of the power converter to decrease and to stay within acceptable industry thermal standards.

Natural convection using air as the heat transfer medium is presently the preferred method to dissipate thermal energy from laptop computers and/or power converters. Air in the enclosure exhibits very low thermal conductivity which tends to decrease the tolerable dissipated power density of the power converter. Forced convection methods (a fan for example) and alternative heat transfer media are undesirable in laptop computer power converters since they would increase the size, cost and weight above acceptable limits. Since the thermal dissipation is limited to natural convection, several methods have been developed to enhance the dissipated power density of natural convection cooled electronics.

The most common electronic packaging method used in the industry to date for a natural convection cooled devices is to design a highly efficient converter and place it in a volume large enough, normally calculated based on 250 milliwatts per cubic inch (mW/in$^3$) using the conventional heat sinks in air method, to dissipate an adequate amount of heat to meet thermal limits. If the package size necessary to house the device using this technique was considered too large from a marketing standpoint then the thermal designer would shrink the unit by applying existing technology such as the addition of a fan or encapsulation of the unit. Both of these are expensive but effective solutions to the problem.

Encapsulation is the predominate method used to solve thermally related packaging problems by increasing tolerable dissipative power densities of natural convection cooled electronics wherein all components are encapsulated, or potted, with a material exhibiting a high thermal conductivity. Encapsulation is very effective and can increase the thermal dissipation densities to approximately 1500 mW/in$^3$ or more. The encapsulation materials, however, are expensive and difficult to use. The prevailing cost is due to labor for handling and curing the potting materials. The potting materials also possess high densities which add unwanted weight. Several of these materials cause problems for electronic devices like transformers and electrolytic capacitors during the curing process because mechanical stress is incurred. Furthermore, encapsulation does not directly dispose of the heat externally but rather redistributes the heat from the heat generating components to surrounding internal circuitry. This approach brings all components in the device closer to an isothermal situation. The now solid internal ambient temperature of the entire power converter increases, affecting heat susceptible components and overall circuit reliability.

SUMMARY OF THE INVENTION

The thermal packaging apparatus of the present invention operates well within the standards specified by UL 1950 while achieving the same or greater dissipated power density as encapsulation with little added weight and cost. The present invention directs the heat flux from the power dissipating devices to the exterior enclosure walls and hence reduces internal ambient temperature. The present invention requires no additional handling, special equipment, curing time or heat activated catalysts. Furthermore, the present invention causes no mechanical stress on the components of the electronic device.

The apparatus of the present invention comprises a box-like plastic enclosure which encompasses the circuitry of an electronic device. The apparatus further comprises heat sink plates made from aluminum, copper, magnesium, or the like, which are fastened in good thermal contact to any components dissipating substantial amounts of heat. The heat sinks include heat fin members which traverse a plane which is parallel to the inner walls of a plastic enclosure and separated from the walls by as small an air gap as possible. The heat sinks provide a thermally conductive path from a heat source to convey heat away from the components to the enclosure walls. The heat dissipates across the air gap, to a continuous layer of material with a high thermal conductivity which spreads the heat flux throughout the plastic enclosure which is then transferred through the enclosure wall to the surrounding air. Ideally, the surface area of the heat fin members should face and run parallel to the enclosure walls to maintain a one to one relationship between the surface areas to maximize thermal transfer to the enclosure wall.

The inner walls of the plastic enclosure may be lined with a thin, preferably continuous film of material that exhibits high thermal conductivity, such as copper, magnesium or aluminum foil or the like, which spreads the internal heat flux across the total surface area of the walls of the plastic enclosure. Preferably, the surface of this heat flux spreader material and the heat fin members are made semi-rough and stained black to facilitate radiant heat transfer and eliminate any hot spots on the exterior and to increase the heat transfer between the heat sink and the enclosure wall. The plastic enclosure may be doped with a material of high thermal conductivity to increase the overall thermal conductivity of the enclosure.

The air gap between the heat sink and the plastic enclosure should be as small as possible to facilitate increased heat transfer. If a component is not at a ground potential, it can be electrically isolated from the heat sink with a thermally conductive isolation pad. This will allow the heat sink to be designed such that the air gap between it and the heat flux spreader is kept minimal. There are several options that can be taken to minimize the air gap between the heat fin and the heat flux spreader. For instance, the heat sink can be tied to earth ground or the primary return to further decrease the air gap required between the heat fin and the heat flux spreader.

In an alternative embodiment, a flexible electrical insulation layer substantially replaces the air gap to improve heat transfer and to ensure electrical insulation from the heat flux spreader layer. This alternative embodiment is preferred in higher power and voltage applications, where the heat flux spreader layer is desired to increase dissipated power density, but which also exhibits electrical conduction properties. For example, in ac to dc power converters, which include high ac and dc voltages as well as insulated primary and secondary portions and which convert a significant amount of power into heat, it is desirable to use a heat flux spreader layer. The heat flux spreader layer, however, increases the risk of electrical conduction between the primary and secondary portions as well as risk of shock to the user due to the increased possibility of conduction through the heat flux spreader layer. An air gap of considerable thickness would otherwise be necessary between the electrical components and the heat flux spreader layer to meet the spacing requirements of the various agencies due to the higher ac and dc voltage levels.

It is further noted that in higher power AC applications, an electromagnetic interference (EMI) shield is typically used to reduce the level of electromagnetic energy radiated since a greater amount of this energy is generated. A metal shell may encompass higher power converters, where the metal shell is grounded to the circuitry. The heat flux spreader layer may be implemented to serve this dual purpose by increasing its thickness and coupling it to ground of the circuitry at convenient locations. Grounding the heat flux spreader layer is also desirable to reduce possibility of electrical shock and thus increase safety. From a thermal standpoint, however, the heat flux spreader layer need not be grounded.

In the preferred embodiment, an ac to dc power converter is disclosed including circuitry mounted on a circuit board and effectively divided into a primary portion and a secondary portion. Electrical components generating significant levels of heat are connected in good thermal contact with heat sinks as previously described. An appropriate electrical insulation layer is preferably cut out from a sheet of electrically insulative material and adhesively bonded with a corresponding heat flux spreader layer cut out from a sheet of heat conductive material. The bonded layers are then folded to form a box-like enclosure to be placed around the ac to dc converter circuitry. The inner electrical insulation layer insulates the outer heat flux spreader layer from the circuitry. This assembly is then placed into a similar box-like plastic enclosure as previously described for the other embodiments. To reduce the possibility of electrical shock and to implement an effective EMI shield, openings are preferably provided in the electrical insulation layer at one or more locations, and the heat flux spreader layer is electrically connected to corresponding grounded locations of the circuitry.

The separate electrical insulation layer allows increased thermal transfer and reduction in the overall size of the converter compared with the previous embodiments using an air gap, since the high voltage electrical components and the heat sinks are placed closer to the heat flux spreader layer and to the plastic enclosure. The high voltage components and the heat fins of the heat sinks may contact the inner surface of the electrical insulation layer, while the outer surface of the electrical insulation layer is in full contact with the heat flux spreader layer, without significant risk of electrical conduction between the circuitry and the heat flux spreader layer. An air gap performing this same function would be significantly wider than the thickness of the electrical insulation layer, so that it allows a reduction in the overall size of the converter. Also, the decreased distance between the heat fins and the heat flux spreader layer allows a significantly improved dissipated thermal power density over an equivalent design using an air gap for electrical insulation. The heat flux spreader layer may also be grounded to serve as an effective EMI shield and to increase safety.

BRIEF DESCRIPTION OF THE DRAWINGS

A better understanding of the present invention can be obtained when the following detailed description of the preferred embodiment is considered in conjunction with the following drawings, in which:

FIG. 3 is a top view of the electronic device looking along lines 3—3 of FIG. 1;

FIG. 4 is a cross-sectional side view of the electronic device looking along lines 4—4 of FIG. 2;

FIG. 5 is a cross-sectional bottom view of the electronic device looking along lines 5—5 of FIG. 1;

FIG. 6 is a cross-sectional end view of the electronic device looking along lines 6—6 of FIG. 2;

FIG. 7 is a top view of an alternate electronic device constructed according to the present invention;

FIG. 9 is a perspective view of the ac to dc converter of FIG. 8;

FIG. 10 is a cross-sectional side view of the ac to dc converter looking along lines 10—10 of FIG. 9; and FIG. 11 is a cross-sectional end view of the ac to dc converter looking lines 11—11 of FIG. 10.

DETAILED DESCRIPTION OF THE PREFERRED EMBODIMENT

Figure 1:
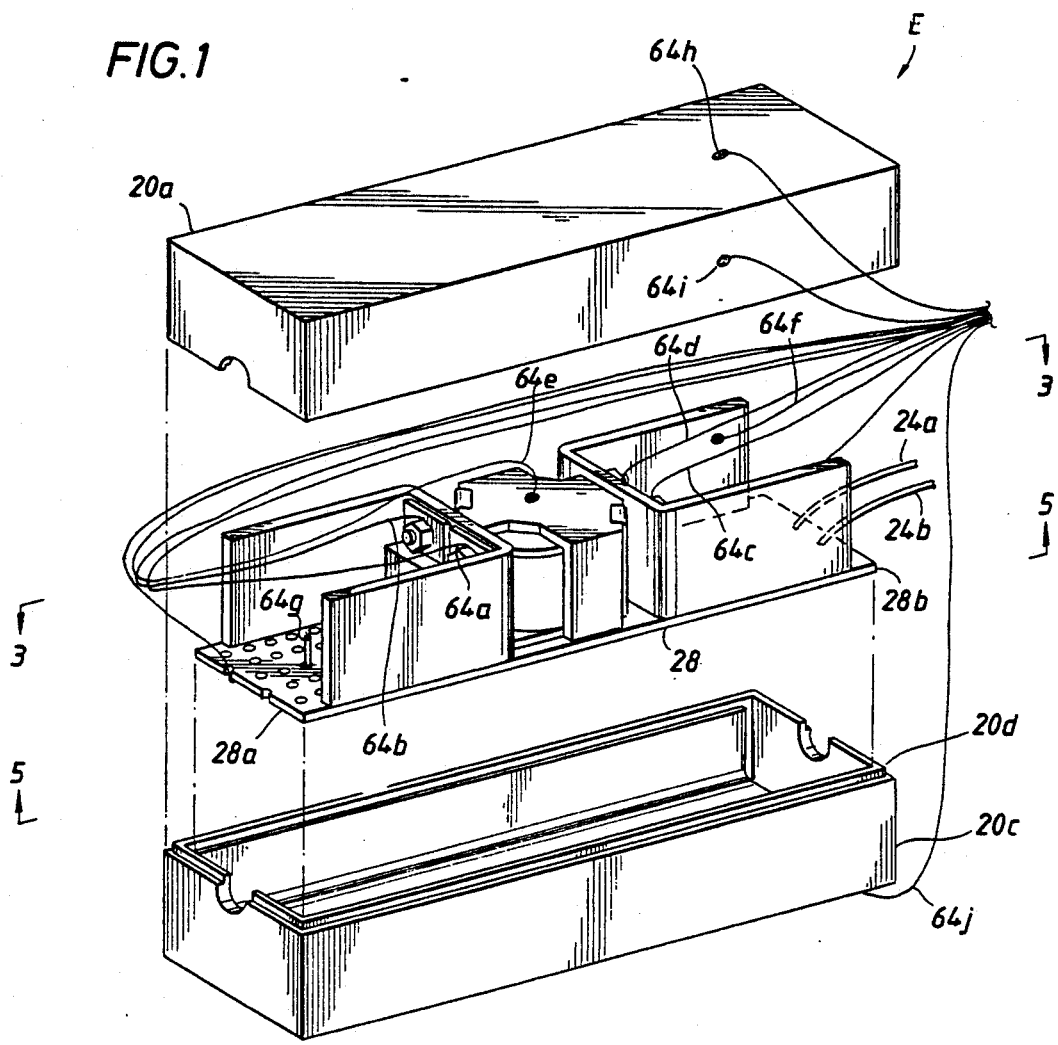
FIG. 1 is an exploded perspective view illustrating an electronic device constructed according to the present invention.

Referring to the drawings, FIG. 1 is an exploded perspective view illustrating an electronic device, generally referred to by the letter E, constructed according to the present invention. The electrical components of the electronic device E are mounted onto a rectangular circuit board 28, and this assembly is placed into the lower half member 20c of a hollow box-like enclosure 20 (FIG. 2), which is preferably shaped like a rectangular parallelepiped. The electronic device E illustrated in the drawings is a test device used for thermal characteristic evaluations, but is similar in size and shape to the intended electronic devices to be used with the present invention, such as dc-dc converters and the like. The enclosure 20 is preferably made of any of the organic polymeric compositions commonly used as structural plastics such as polyesters, especially a thermoplastic polyester sold under the trade mark Valox by General Electric, acrylonitrile-butadiene-styrenes (ABS), polycarbonates, and the like. It is desirable that the organic polymeric composition used be able to conduct heat readily and not melt at the temperature of use. Furthermore, the organic polymeric composition may be filled with a conductive filler such as aluminum or copper powder, or the like, to increase the heat conductivity of the composition. The enclosure 20 comprises an upper half member 20a and the lower half member 20c. The lower half member 20c includes a rabbet 20d that protrudes above the inside of its upper edge, and the upper half member 20a includes a similar rabbet 20b (FIG. 4) along its lower edge to mate with the lower rabbet 20d.

The enclosure 20 preferably includes flat surfaces and squared-off corners to facilitate ease of construction. The enclosure 20 of the preferred embodiment is approximately 1.25" wide by 1.25" tall by 4.25" long and its walls approximately 0.09375" thick such that the interior dimensions of the enclosure 20 are approximately 1" by 1" by 4". The rabbet 20d of the lower half member 20c is approximately 0.03125" wide and 0.0597" deep, and the rabbet 20b of the upper half member 20a is approximately the same dimensions as the rabbet 20d.

Figure 2:
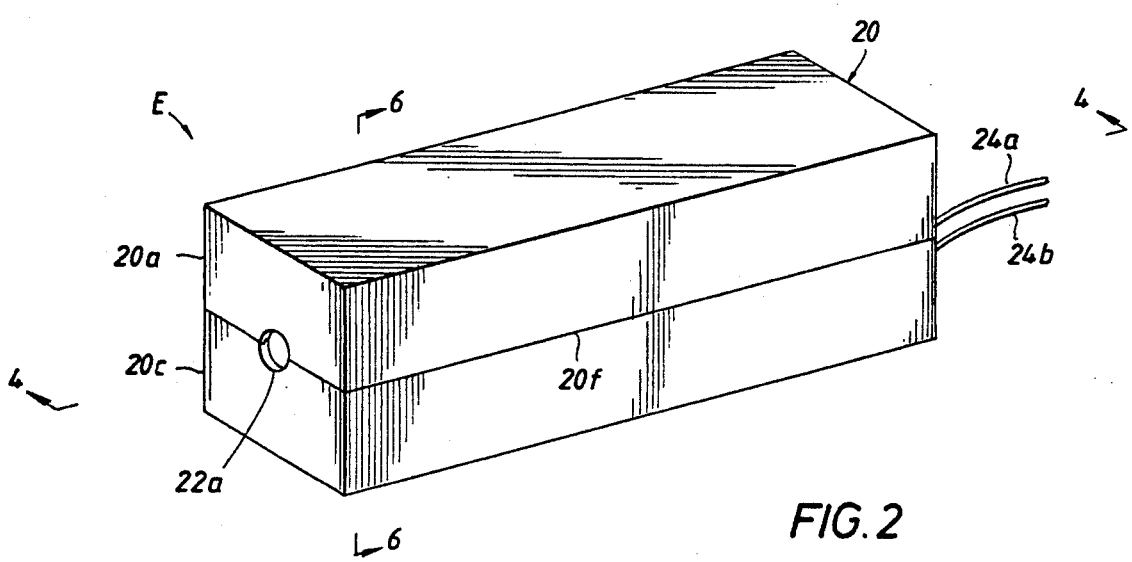
FIG. 2 is a perspective view of the electronic device of FIG. 1.

FIG. 2 is a perspective view showing the outside of the assembled enclosure 20 of the electronic device E of FIG. 1. The upper half member 20a and the lower half member 20c join together such that the rabbets 20b and 20d lock together (FIG. 4) at approximately the longitudinal centerline 20f of the sides and ends of the assembled enclosure 20. The walls of the assembled enclosure 20 are preferably flat, but could include curvilinear portions if such curvilinear portions would be more convenient depending upon the shape of the electronic device E being packaged. Two holes 22a and 22b (FIG. 3), each having an approximate diameter of 0.0323", are drilled at each end of the assembled enclosure 20 to facilitate entry of input and output wires, such as the wires 24a and 24b.

FIG. 3 is a top view of the electronic device E with the upper half member 20a removed. A power transformer 26, the size of which is typical of a transformer used in a dc-dc power converter for a laptop computer, is mounted in the center of the circuit board 28. The transformer 26 is not electrically coupled in the illustrated embodiment and is present for thermal measurements only in the illustrated embodiment. Four 10 ohm power resistors 30, 32, 34 and 36, each in TO-220 packaging, are mounted to the circuit board 28. The resistors 30 and 32 are mounted side by side next to one side of the transformer 26 facing away from the transformer 26, and the resistors 34 and 36 are mounted similarly on the opposite side of the transformer 26 facing the opposite direction. The resistors 30, 32, 34 and 36 simulate transistors, diodes, thyristors or other electronic elements conventionally used in electronic devices.

The lower half member 20c of the enclosure 20 may include four bosses 21a, 21b, 21c and 21d (FIG. 5) integrally formed on the bottom portion near the four corners, respectively, of the lower half member 20c, which preferably comprises the same material as the enclosure 20. As shown more clearly in FIG. 4, the circuit board 28 is placed within the lower half member 20c to rest on the bosses 21a-21d, where the bosses 21a-21d have an appropriate height to separate the circuit board 28 from the lower wall or bottom of the enclosure 20. Four screws 23a, 23b, 23c and 23d are placed through corresponding holes (not shown) of the circuit board 28 and are screwed into the bosses 21a-21d, respectively, to mount the circuit board 28 to the lower half member 20c of the enclosure 20. In this manner, the circuit board 28 is securely mounted within the enclosure 20.

A generally U-shaped heat sink 38 includes a flat center fastening member 38a and two flat heat fin members 38b, which are integrally formed with and extend transversely with respect to each end of the fastening member 38a. The heat sink 38 is preferably made from a high thermal conductivity material, such as aluminum, copper, magnesium or the like, and is preferably about 0.065" thick. The heat sink 38 is oriented to lie flat on its side on the circuit board 28 such that its fastening member 38a is located between the transformer 26 and the resistors 30 and 32 and wherein its heat fin members 38b extend vertically upwards above the sides of the circuit board 28, outward towards one end 28a of the circuit board 28 and parallel to the sides of the enclosure 20 (FIG. 1).

FIG. 4 is a cross-sectional side view of the electronic device E. The resistor 30 is fastened to the heat sink 38 with a bolt 40 and a nut 42. The bolt 40 is placed through the fastening member 38a and through the resistor 30, and the nut 42 is securely screwed onto the bolt 40. Thermal heat sink compound can be used if desired to further improve the thermal coupling or to electrically insulate the heat sink 38 and the device. In a similar fashion, the heat sink 38 is fastened to the resistor 32 with the bolt 44 and the nut 46 (FIG. 3). In this fashion, the heat sink 38 is securely fastened to and in good thermal contact with the resistors 30 and 32. Other means, as would be appreciated by those skilled in the art, could be used to establish good thermal contact between the heat sink 38 and the resistors 30 and 32.

In the manner described above, most of the heat generated by the resistors 30 and 32 is transferred to the fastening member 38a of the heat sink 38. The heat is then conveyed to the heat fin members 38b which, as described, are integrally formed with the fastening member 38a. The heat sink 38, therefore, forms a thermal conductive path which conveys heat away from the heat generating resistors 30 and 32 to the heat fin members 38b. The heat is further communicated to the enclosure 20 as will be more fully described below.

Another heat sink 48, preferably the same shape and material as the heat sink 38, is fastened in a similar fashion to the resistors 34 and 36 using two bolts 50 and 54 and two nuts 52 and 56 respectively. The heat sink 48 is also physically oriented with respect to the resistors 34 and 36 in the same manner as the heat sink 38 is oriented to the resistors 30 and 32 such that its two heat-fin members 48b extend towards the opposite end 28b of the circuit board 28 (FIG. 1). The heat sink 48 functions to convey heat away from the resistors 34 and 36 in the same manner as the heat sink 38 conveys heat away from the resistors 30 and 32.

FIG. 5 is a cross-sectional bottom view of the electronic device E illustrating the wires 24a and 24b routed on the bottom side of the circuit board 28. The wire 24a is routed and connected to one terminal of each of the resistors 30, 32, 34 and 36 at the soldered locations 30a, 32a, 34a and 36a respectively, and the wire 24b is routed and connected to the opposite terminals of each of the resistors 30, 32, 34 and 36 at the soldered locations 30b, 32b, 34b and 36b respectively. The wires 24a and 24b are then routed through the circuit board 28 through 2 holes 28c and 28d respectively, and then out of the electronic device E through the hole 22b for external connection. In the illustrated embodiment, the wires 24a and 24b are discretely connected to the resistors 30, 32, 34 and 36, but it is understood that the circuit board 28 conventionally contains traces interconnecting the various elements of the electronic device E and the wires 24a and 24b are only used for the external connections.

FIG. 6 is an cross-sectional end view of the electronic device E. The inner walls of the enclosure 20 are preferably lined with a flexible heat flux spreader layer 60. The heat flux spreader layer 60 is preferably made of a thermally conductive material, such as metal foil made of copper or aluminum or the like, or a thermally conductive coating applied to the inner surfaces of the enclosure 20 through an electroplating or other coating process. It is desirable that the heat flux spreader layer 60 spreads the internal heat flux radiated and convected from the heat sinks 38 and 48 across the total surface area of the walls of the enclosure 20. For practical purposes, the heat flux spreader layer 60 could comprise a layer 60a on the inner surfaces of the upper half member 20a, and a layer 60b on the inner surfaces of the lower half member 20c.

If the heat flux spreader layer 60 is made of a metal foil, the foil is shaped to conform to the inner walls of the enclosure 20, and then bonded to the walls with a glue or other adhesive which preferably has a high thermal conductivity. Preferably, the entire interior or exposed surface 60c of the heat flux spreader layer 60 as well as the surfaces of the heat sinks 38 and 48 facing the heat flux spreader layer 60 are made semi-rough and stained black to increase the radiant heat transfer between the two surfaces and eliminate any hot spots on the exterior.

The heat sinks 38 and 48 are formed such that they are in good thermal contact with the resistors 30, 32, 34 and 36, and, in general, any other component that generates a significant amount of heat within an electronic device, such as the electronic device E, such as power resistors, diodes, transistors, transformers or the like. The heat sinks 38 and 48 include the heat fin members 38b and 48b which align next to and run parallel with the inner walls of the enclosure 20 (FIG. 3), separated from the heat flux spreader sheet 60 by an air gap 62. The air gap 62 should be as small as possible to maximize the heat transfer. Preferably the heat sink 38 is at earth ground or a return voltage to decrease the air gap 62 mandated by voltages differences.

In general, the enclosure 20 is made as small as possible to enclose all of the components yet large enough to include the heat flux spreader layer 60 and the heat sinks 38 and 48. The surface areas of the heat fin members 38b and 48b facing the heat flux spreader layer 60 are made as large as possible to maximize the amount of heat transferred between the heat sinks 38 and 48 and the enclosure 20 to maximize the amount of heat communicated. While not shown in the drawings, the enclosure 20 can include additional heat fin members (not shown) running parallel with the top of enclosure 20 to provide additional heat transfer.

FIG. 1 further illustrates ten welded junction J-type thermocouples 64a-j with 30 gauge wires used to measure the temperature at ten locations. Each of the thermocouples 64a-j, except for the thermocouple 64g, is attached at its respective location using thermal epoxy to create a good thermal contact. The thermocouples 64a, 64b, 64c and 64d are each attached to the resistors 30, 32, 34 and 36, respectively. The thermocouple 64e is attached to the top side of the the inner side towards the end of the heat fin member 48b of the heat sink 48. A thermocouple 64g is mounted through the circuit board 28 about halfway between the resistors 30 and 32 and the end 28a of the circuit board 28. Three more thermocouples 64h-j are attached toward one end of the exterior of the enclosure 20. These locations allow the temperature to be measured at the ten specified locations using the thermocouples 64a-j as known to those skilled in the art.

The method of measuring the dissipated power density of the electronic device E will now be described. The test procedures used are within the acceptable procedures as specified in UL 1950. The maximum room ambient temperature is specified as 40° C. for the desired embodiments, and the electronic device E is tested in continuous operation until steady state temperature conditions are established. All temperatures are measured using the thermocouples 64a-j as described above.

A known voltage was placed across the wires 24a and 24b such that the resistors 30, 32, 34 and 36 are electrically in parallel, and the current passing through the wires 24a and 24b was measured. The amount of thermal power dissipated by the resistors 30, 32, 34 and 36 within the electronic device E was calculated by multiplying the voltage across the resistors 30, 32, 34 and 36 by the current through them. Since the internal volume of the enclosure 20 is known, the dissipated power density was easily calculated by dividing the amount of power dissipated, by the volume of the enclosure 20. The volume used in the calculation was the effective internal volume available for hardware placement, which was approximately 4 in$^3$. Table 1 lists the measured values for four dissipated power tests, at approximately 525, 1000, 1500 and 2000 mW/in$^3$, respectively:

TABLE 1

| | DISSIPATED POWER DENSITY TESTS | | | |
|---|---|---|---|---|
| POWER TEST | VOLT-AGE (VOLTS) | CURRENT (AMPERES) | DISSIPATED POWER (WATTS) | DISSIPATED POWER DENSITY (mW/in$^3$) |
| A | 2.35 | 0.895 | 2.10 | 524.78 |
| B | 3.25 | 1.248 | 4.06 | 1014.00 |
| C | 3.97 | 1.527 | 6.06 | 1515.55 |

TABLE 1-continued

DISSIPATED POWER DENSITY TESTS

| POWER TEST | VOLTAGE (VOLTS) | CURRENT (AMPERES) | DISSIPATED POWER (WATTS) | DISSIPATED POWER DENSITY (mW/in$^3$) |
|---|---|---|---|---|
| D | 4.56 | 1.766 | 8.05 | 2013.24 |

For each of the four tests, the ambient air temperature, $T_{AMB}$, was monitored during all testing of the electronic device E. The temperature of each of the thermocouples 64a–j was monitored during the various levels of power dissipation to determine when the temperatures stabilized. The temperature rise from ambient was calculated by subtracting the recorded ambient air temperature from the final or stabilized temperatures. A pass/fail temperature margin ($T_{P/F}$) calculation was developed to track the thermal progress of the apparatus during testing. $T_{P/F}$ is measured in degrees Celsius (°C.) and was calculated for thermocouples 64a–j to determine whether the electronic device E was meeting safety and/or reliability thermal limits as operated in a 40° C. room ambient. Therefore, the formula used was not the same for each thermocouple. A positive margin indicates the number of °C. by which that particular thermocouple was passing that test. Likewise, a failing margin designated by a negative value indicates the number of °C. by which that particular thermocouple was failing that particular test.

The resistors 30, 32, 34 and 36 are packaged in plastic and physically represent similar devices such as various transistors used extensively in power converters that dissipate a large percentage of the overall dissipative power and have a silicon junction that should not exceed 125° C. in order to maintain the reliability of the component. The thermocouples 64a–d were attached to the metal tab of the TO-220 style package and thus measured a slightly lower temperature than would be the actual silicon junction temperature. A margin of error of 5° C. was added to account for this error. $T_{P/F}$ for the thermocouples 64a–d was calculated from the following formula:

$$T_{P/F} = 125 - (T_{RISE} + 45)$$

where $T_{RISE}$ is the measured ambient air temperature subtracted from the measured temperature at the thermocouple.

The transformer 26 must not rise more than 105° C. when tested in approximately a 25° C. ambient air temperature in order to be classified as a class B magnetic component as defined by UL 1950. This is the standard for a maximum operating ambient of 40° C. $T_{P/F}$ was, therefore, calculated from the following formula for the thermocouple 64e:

$$T_{P/F} = 105 - (T_{RISE} + 25)$$

The temperature of the exterior of the enclosure 20, as measured by the thermocouples 64h–j, is allowed to rise 70° C. from any specified ambient according to UL 1950. This, however, is higher than desired since the outside of the box should not feel too hot to the touch. $T_{P/F}$ is, therefore, limited to a maximum value of 70° C. as tested in a 25° C. room ambient for each thermocouple 64h–j. The formula to calculate $T_{P/F}$ for the thermocouples 64h–j was:

$$T_{P/F} = 70 - (T_{RISE} + 25)$$

The remaining thermocouples 64f and 64g do not have any specified limits. However, to remain within the most thermally restrictive conditions for the desired embodiments, the thermocouples 64f and 64g were limited to a rise of 70° C. as tested in a 25° C. ambient. The formula used to calculate $T_{P/F}$ for the thermocouples 64f and 64g, therefore, was the same as used for the thermocouples 64h–j above. Tables 2 through 5 list the measured and calculated temperature levels for the dissipated power tests A through D, respectively:

TABLE 2

TEMPERATURES FOR POWER TEST A - 525 mW/in$^3$

| THERMOCOUPLE DESIGNATION | TEMPERATURE (°C.) | $T_{RISE}$ (°C.) | PASS MARGIN $T_{P/F}$ (°C.) FOR 40° C. AMBIENT |
|---|---|---|---|
| $T_{AMB}$ | 24.7 | — | — |
| 64a | 48.6 | 23.9 | 56.1 |
| 64b | 48.6 | 23.9 | 56.1 |
| 64c | 47.2 | 22.5 | 57.5 |
| 64d | 47.0 | 22.3 | 57.7 |
| 64e | 43.3 | 18.6 | 61.4 |
| 64f | 45.4 | 20.7 | 24.3 |
| 64g | 42.8 | 18.1 | 26.9 |
| 64h | 36.6 | 11.9 | 33.1 |
| 64i | 37.6 | 12.9 | 32.1 |
| 64j | 40.5 | 15.8 | 29.2 |

TABLE 3

TEMPERATURES FOR POWER TEST B - 1000 mW/in$^3$

| THERMOCOUPLE DESIGNATION | TEMPERATURE (°C.) | $T_{RISE}$ (°C.) | PASS MARGIN $T_{P/F}$ (°C.) FOR 40° C. AMBIENT |
|---|---|---|---|
| $T_{AMB}$ | 24.7 | — | — |
| 64a | 69.1 | 44.4 | 35.6 |
| 64b | 69.2 | 44.5 | 35.5 |
| 64c | 66.3 | 41.6 | 38.4 |
| 64d | 65.9 | 41.2 | 38.8 |
| 64e | 59.3 | 34.6 | 45.4 |
| 64f | 62.8 | 38.1 | 6.9 |
| 64g | 57.9 | 33.2 | 11.8 |
| 64h | 46.6 | 21.9 | 23.1 |
| 64i | 48.4 | 23.7 | 21.3 |
| 64j | 53.6 | 28.9 | 16.1 |

TABLE 4

TEMPERATURES FOR POWER TEST C - 1500 mW/in$^3$

| THERMOCOUPLE DESIGNATION | TEMPERATURE (°C.) | $T_{RISE}$ (°C.) | PASS MARGIN $T_{P/F}$ (°C.) FOR 40° C. AMBIENT |
|---|---|---|---|
| $T_{AMB}$ | 25.1 | — | — |
| 64a | 88.7 | 63.6 | 16.4 |
| 64b | 88.9 | 63.8 | 16.2 |
| 64c | 84.7 | 59.6 | 20.4 |
| 64d | 83.9 | 58.8 | 21.2 |
| 64e | 74.4 | 49.3 | 30.7 |
| 64f | 79.4 | 54.3 | −9.3 |
| 64g | 72.2 | 47.1 | −2.1 |
| 64h | 56.1 | 31.0 | 14.0 |
| 64i | 58.2 | 33.1 | 11.9 |
| 64j | 65.8 | 40.7 | 4.3 |

TABLE 5

TEMPERATURES FOR POWER TEST D - 2000 mW/in³

| THERMO-COUPLE DESIGNATION | TEMPERATURE (°C) | $T_{RISE}$ (°C) | PASS MARGIN $T_{P/F}$ (°C) FOR 40° C. AMBIENT |
|---|---|---|---|
| $T_{AMB}$ | 25.5 | — | — |
| 64a | 107.8 | 82.3 | −2.3 |
| 64b | 108.0 | 82.5 | −2.5 |
| 64c | 102.3 | 76.8 | 3.2 |
| 64d | 101.3 | 75.8 | 4.2 |
| 64e | 89.2 | 63.7 | 16.3 |
| 64f | 95.0 | 69.5 | −24.5 |
| 64g | 86.4 | 60.9 | −15.9 |
| 64h | 65.5 | 40.0 | 5.0 |
| 64i | 68.4 | 42.9 | 2.1 |
| 64j | 77.9 | 52.4 | −7.4 |

Tables 2 and 3 indicate that all the temperatures are within allowable levels at all the thermocouples locations 64a-j for dissipated power densities of approximately 525 and 1000 mW/in³ respectively. Table 4 indicates marginal failures at 40° C. at thermocouples 64f and 64g at dissipated power density of approximately 1500 mW/in³. The marginal failure points could be easily removed by minor optimization readily performed by one skilled in the art. Table 5 indicates failures at the majority of thermocouple locations at a dissipated power density of approximately 2000 mW/in³ for the specific test sample. The addition of a third heat fin member extending over the top of the resistors 30, 32, 34 and 36 would solve these thermal issues.

FIG. 7 is a top view of an electronic device, generally referred to by the letter E', constructed according to the present invention. Analogous components assume similar numbers as used for the electronic device E. The electronic device E' is similar to the electronic device E except that it is about 2 inches shorter. A transformer 26' and 4 resistors 30', 32', 34' and 36' preferably the same as used in the electronic device E, are mounted on a circuit board 28'. A heat sink 38' is mounted to the resistors 30' and 32' with bolts 40' and 44', nuts 42' and 46', in the same manner as described above. A heat sink 48' is likewise mounted to the resistors 34' and 36' with bolts 50' and 54' and nuts 52' and 56'. The heat sinks 38' and 48' comprise fastening members 38a, and 48a' and heat fin members 38b' and 48b', which are similar to the heat sinks 38 and 48 except that the heat fin members 38b'and 48b' are about 1" shorter than the heat fin members 38b and 48b. The assembly is placed into the lower half member 20c' of an enclosure 20' which is similar to the enclosure 20 except that it is about 2" shorter in length. Four bosses (not shown) and four screws 23a, 23b, 23c and 23d are provided in a 20 similar fashion as described above for the bosses 21a-21d and the screws 23a-23d to support and mount the circuit board 28' within the lower half member 20c'. The internal dimensions of the enclosure 20' are approximately 2" by 1" by 1" so that it is about half the volume of the enclosure 20. Ten thermocouples 64a'-j' (not shown) are placed on the electronic device E' in analogous locations as the thermocouples 64a-j on the electronic device E.

Four dissipated power tests were executed with the electronic device E' at approximately the same dissipated power densities as were used in the dissipated power tests A-D of the electronic device E. The power dissipated in the electronic device E' was about half the power dissipated in the electronic device E such that the dissipated power densities were approximately equal; the inner volume of the electronic device E' (2 in³) was half that of the electronic device E (4 in³). Table 6 lists the differences in temperature between the electronic device E' and the electronic device E at each thermocouple 64a-j' for four dissipated power densities:

TABLE 6

TEMPERATURE DIFFERENTIAL BETWEEN THE ELECTRONIC DEVICE E' AND THE ELECTRONIC DEVICE E AT VARIOUS DISSIPATED POWER DENSITIES

| THERMOCOUPLE DESIGNATION | DISSIPATED POWER DENSITY (mW/in³) | | | |
|---|---|---|---|---|
| | 500 | 1000 | 1500 | 2000 |
| 64a' | −2.2 | −4.8 | −7.3 | −8.8 |
| 64b' | −2.3 | −5.1 | −7.7 | −9.2 |
| 64c' | −1.3 | −2.5 | −3.8 | −4.0 |
| 64d' | −1.0 | −2.1 | −2.8 | −2.9 |
| 64e' | −2.0 | −4.5 | −6.3 | −7.6 |
| 64f' | +0.4 | +0.6 | +1.0 | +2.6 |
| 64g' | −2.4 | −4.9 | −7.5 | −9.5 |
| 64h' | −2.4 | −5.5 | −8.1 | −9.5 |
| 64i' | −2.8 | −6.4 | −8.2 | −10.5 |
| 64j' | −1.0 | −2.3 | −2.4 | −1.8 |

Table 6 shows that the temperatures at all thermocouples 64a'-j' of the electronic device E', except for the thermocouple 64f', were not as high as the temperatures measured by the thermocouples 64a'-j' of the electronic device E. The thermocouple 64F' anomaly developed because the thermocouple 64F' was not placed in the properly proportionate places as the thermocouple 64F. These results indicate that the electronic device E' has an even greater potential dissipated power density while meeting applicable standards than the electronic device E.

The electronic devices E and E' described above are test devices used for thermal characteristic evaluations but are similar in size and shape to the intended electrical devices to be used with the present invention, such as dc-dc power converters and the like. The amount of heat dissipated by the resistors 30, 32, 34 and 36 of the electronic device E, and the resistors 30', 32', 34' and 36' of the electronic device E', simulates the approximate amount of heat dissipated by rectifiers, diodes, transistors, transformers, and the like, that are typically used in natural convection cooled electronic devices intended to be used with the present invention. Similarly, the method of fastening these heat dissipating components to heat sinks, such as the heat sinks 38 and 48, is substantially similar.

Figure 8:
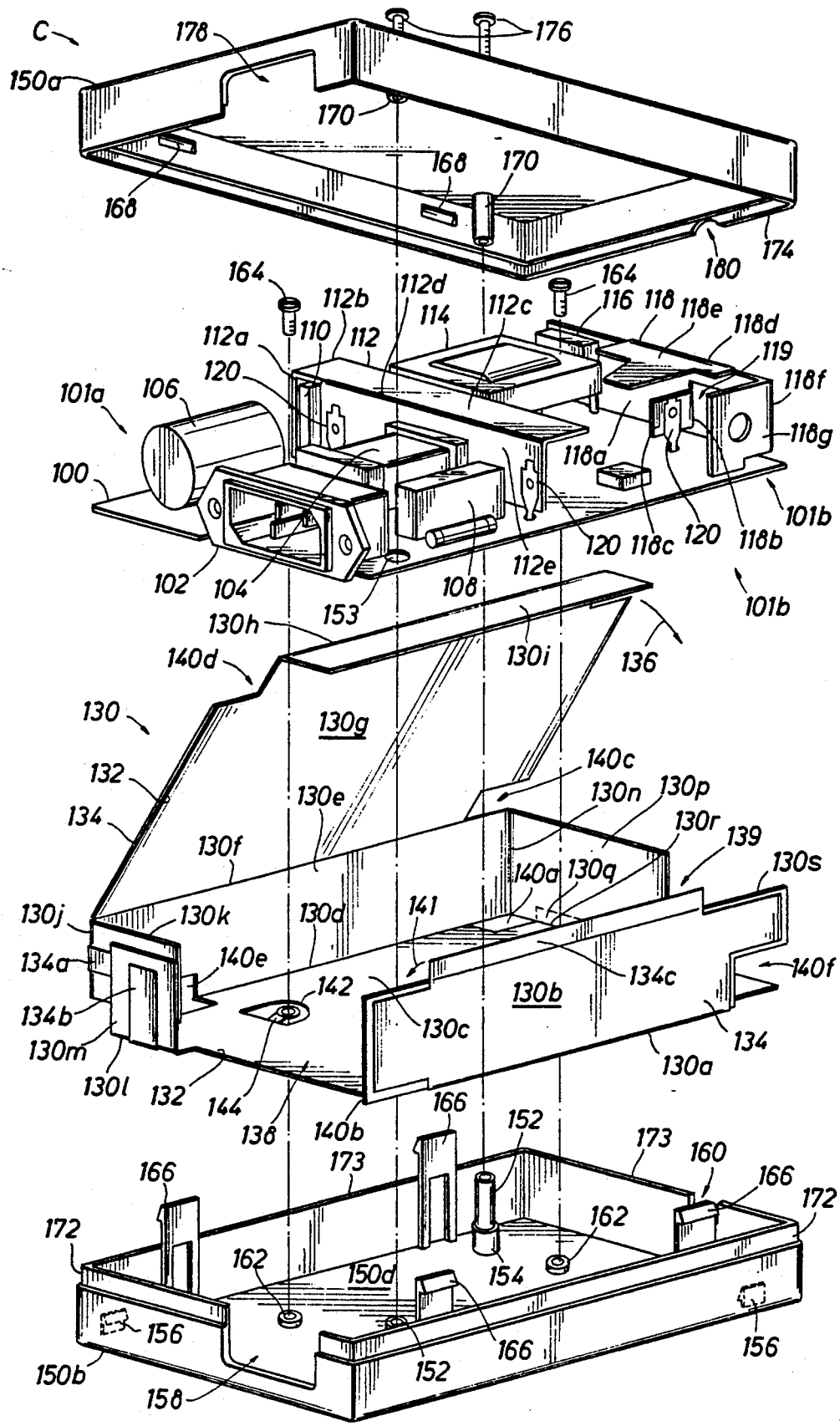
FIG. 8 is an exploded perspective view illustrating an ac to dc converter constructed according to an alternative embodiment of the present invention.

Referring now to FIG. 8, an exploded perspective view of an ac to dc converter is shown, generally referred to by the letter C, which is implemented according to an alternative embodiment of the present invention. The ac to dc converter C converts ac line voltage to a dc voltage preferably ranging from 10 to 18 volts, and provides approximately 35 watts of power to charge a Nickel-based battery and to operate a computer, although the present invention is not limited to any particular electronic device.

The electrical components of the ac to dc converter C are preferably mounted onto a generally rectangular printed circuit board 100, which is suitable for mounting electrical components and for routing traces suitable for carrying the various signals of the ac to dc converter C. The details of the operation of the ac to dc converter C will not be described, although a few of the electrical components will be generally identified for purposes of illustration.

The entire electrical assembly mounted on the circuit board 100 of the ac to dc converter C is placed into a generally flexible box-like enclosure 130, which preferably has the general shape of a hollow rectangular parallelepiped. The enclosure 130 is placed into a lower half member 150b of an organic polymeric enclosure 150, which is preferably similar and analogous to the similar materials. The enclosure 150 includes the lower half member 150b and an upper half member 150a, which preferably fit together to form the shape of a hollow rectangular parallelepiped in an analogous manner as the enclosure 20, and which also form an inner cavity for receiving the inner enclosure 130. The enclosure 150 preferably includes flat surfaces and squared-off corners to facilitate ease of construction so that its walls are generally flat, although it could include curvilinear portions depending upon the shape of the circuitry being packaged.

A rabbet 172 having an upper edge 173 protrudes above the inside of the upper edge of the lower half member 150b to mate with a similar corresponding rabbet 174 protruding below the outside of the lower edge of the upper half member 150a to provide appropriate alignment between the upper and lower half members 150a and 150b. In this manner, the upper half member 150a and the lower half member 150b join together so that the rabbets 172 and 174 lock together (FIG. 11) at approximately the longitudinal centerline 150i (FIG. 9) of sides 150e and 150f and ends 150g and 150h of the assembled enclosure 150. Also, the lower half member 150b includes four clips 166 integrally formed with and located near the four corners of the lower half member 150b, which protrude above the edge 173 to physically communicate with corresponding clip receptacles 168 (only two shown) formed in corresponding locations of the upper half member 150a of the enclosure 150. In this manner, the rabbets 172 and 174 provide alignment and the clips 166 snap to the clip receptacles 168 to securely fasten the members 150a and 150b together as more clearly shown in FIGS. 9 and 11.

Two circular posts 152 are integrally formed near corresponding and opposing corners on a bottom side 150d of the lower half member 150b. Two posts 170 with center holes are provided integrally formed with the upper half member 150a at opposite corners which align with the two corresponding posts 152. Two screws 176 are placed through the center holes of the posts 170 and screwed into the posts 152 to securely fasten the upper and lower half members 150a and 150b of the enclosure 150 together. The external dimensions of the assembled enclosure 150 are preferably approximately 3.2 inches wide by 1.4 inches tall by 5.2 inches long.

The components of the ac to dc converter C are generally separated into primary components mounted on a primary portion 101a of the circuit board 100, and secondary components mounted on a secondary portion 101b of the circuit board 100. On the primary portion 101a, a three terminal ac receptacle 102 is provided which receives ac line voltage from a suitable ac cord (not shown). The ac line voltage is filtered through a primary input common mode choke 104, a filter capacitor 108 and various other components (not shown) for filtering the ac line voltage. The ac voltage is rectified through a rectifier bridge (not shown) generally providing an unregulated dc voltage, which is filtered by a filter capacitor 106. The unregulated dc voltage is preferably approximately 400 volts in the preferred embodiment. Other resistors, capacitors and various electrical components are included but are not shown for purposes of convenience and clarity.

The unregulated dc voltage is applied to the primary of a transformer 114, which is preferably located on the secondary portion 101b of the circuit board 100. Also, a switching transistor 110, which is preferably an n-channel metal-oxide-semiconductor-field-effect-transistor (MOSFET), is included and controlled by a pulse width modulation (PWM) circuit (not shown) for switching current through the primary of the transformer 114. The switching transistor 110 typically generates significant amounts of heat since it switches relatively large levels of current through the primary of the transformer 114. Thus, the transistor 110 is preferably provided in a TO-220 insulated package and mounted in good mechanical and thermal contact to a generally planar fastening member 112a of a generally L-shaped heat sink 112. The mounting means to mount the transistor 110 to the heat sink 112 is preferably a bolt 113 and nut 115 (FIG. 10), although other suitable mounting methods may be used as known to those skilled in the art. Also, a layer of thermal grease (not shown) is preferably provided between the transistor 110 and the heat sink 112 to improve thermal heat transfer. The heat sink 112 is preferably made from a high thermal conductivity material, such as aluminum, copper, magnesium or the like, and is preferably about 0.062 inches thick. The heat sink 112 is also painted or otherwise colored black to increase thermal conductivity. The terminals 117 (FIG. 10) of the switching transistor 110 are connected in good mechanical contact with the circuit board 100. In this manner, the switching transistor 110 provides mechanical support for the heat sink 112 and allows good heat transfer from the switching transistor 110 to the fastening member 112a of the heat sink 112.

The heat sink 112 includes a generally planar heat fin member 112c, which is integrally formed with the fastening member 112a along an upper edge 112b, so that the heat fin member 112c extends traversely with respect to the fastening member 112a. The heat sink 112 also includes a generally planar support member 112e, which is integrally formed with the heat fin member 112c along an edge 112d and extends traversely with respect to the heat fin member 112c towards the circuit board 100. The support member 112e also preferably forms a Faraday shield between the primary and secondary portions 101a and 101b of the circuit board 100. Two support stakes 120 are preferably connected to opposite ends of the support member 112e and also to the circuit board 100, to provide mechanical support for the heat sink 112. The support member 112e increases strength to meet shock and vibration testing requirements, and also adds thermal mass to the heat sink 112, although extra thermal mass is not necessarily required in the preferred embodiment. The heat sink 112 forms a thermal conductive path which conveys heat away from the transistor 110 to the fastening member 112a and to the heat fin member 112c. Heat is then communicated from the fastening member 112a and the heat fin member 112c to the enclosure 150 in a similar manner as described previously.

The secondary of the transformer 114 is connected to a pair of rectifier diodes 116 to develop the dc voltage provided at the output of the ac to dc converter C, which is provided through a dc receptacle (not shown).

The rectifier diodes 116 are shown since they conduct a significant amount of current and thus generate a significant amount of heat, and are preferably provided in TO-218 or TO-220 packaging. The diodes 116 are preferably mounted in good mechanical contact with the circuit board 100 and are also connected in good mechanical and thermal contact with a generally planar fastening heat fin member 118a of a heat sink 118. Again, the mounting means is preferably a nut and bolt (not shown) using a layer of thermal grease to increase thermal conduction, in a similar manner as for the transistor 110. In this manner, the terminals (not shown) of the diodes 116 provide mechanical support for the heat sink 118 and good heat conduction occurs from the diodes 116 to the heat sink 118. The heat sink 118 is preferably made from similar materials, constructed in a similar fashion and has approximately the same thickness and color as the heat sink 112.

The fastening heat fin member 118a also preferably includes an opening 119 which is used to allow connection between the dc receptacle of the ac to dc converter C to a dc cord 180 (FIG. 9). In the preferred embodiment, the opening 119 is formed by a partial cut out of the fastening heat fin member 118a forming a tab 118c integrally formed with the fastening heat fin member 118a along an edge 118b, and then folding the tab 118c at the edge 118b to extend traversely with respect to the fastening heat fin member 118a. The tab 118c is preferably connected to a support stake 120 which is further connected to the circuit board 100 to provide mechanical support for the heat sink 118. Furthermore, the heat sink 118 includes a generally planar heat fin member 118e integrally formed with the fastening heat fin member 118a along an upper edge 118d of the fastening heat fin member 118a, where the heat fin member 118e extends traversely with respect to the fastening heat fin member 118a along the edge 118d. The fastening heat fin member 118a also includes a heat fin member 118g which extends traversely from and is integrally formed with the fastening heat fin member 118a along a side edge 118f. In this manner, the heat sink 118 forms a thermal conductive path which conveys heat away from the diodes 116 to the members 118a, 118e and 118g of the heat sink 118, where the heat is then communicated to the enclosure 150.

The enclosure 130 preferably comprises a flexible electrical insulation layer 132 forming an inner layer of the enclosure 130, where the electrical insulation layer 132 is adhesively bonded to a heat flux spreader layer 134 forming an outer layer of the enclosure 130. Adhesively bonding the electrical insulation and heat flux spreader layer 132 and 134 is not required although it allows a particularly convenient embodiment since the layers are easier to handle. The electrical insulation layer 132 preferably comprises an electrically insulative plastic, preferably able to flex when fabricated into a sheet or box, able to conduct heat readily and not melt at the temperature of use, and able to adhere to metal foil at its surface with an adhesive. In the preferred embodiment, the electrical insulation layer 132 is formed by cutting out a portion of a sheet of polycarbonate resin sold under the trademark Lexan FR 700 or FR 701 by General Electric, which is preferably flexible, textured and colored black for improved heat transfer, and which preferably has a thickness of approximately 0.017 inches. This particular thickness is desirable for purposes of safety, since a thinner layer would suffice for functional purposes. Other plastic materials could be used as known to those skilled in the art, such as polyetherimide resins, thermoplastic alloys, or thermoplastic polyester resins.

The heat flux spreader layer 134 is preferably made of a thermally conductive material, such as metal foil made of copper or aluminum or the like, and is preferably formed by cutting out a portion of a sheet of aluminum foil having a thickness of approximately 0.008 inches. Other thicknesses could be used depending upon the particular embodiment. In fact, a thinner sheet of aluminum foil would suffice, although a thicker one is preferably used to implement an effective electromagnetic interference (EMI) shield. Before folding, the electrical insulation layer 132 and the heat flux spreader layer 134 are adhesively bonded together preferably using #9471 acrylic adhesive manufactured by the Minnesota Mining & Manufacturing Co. (3M), which exhibits good thermal conductivity and meets bonding requirements at temperatures of approximately 125° C. Other suitable adhesives may be used which meet appropriate bonding requirements at other temperatures. For example, silicon-based adhesives are more expensive than acrylic adhesives, but typically meet suitable bonding requirements at higher temperatures.

The electrical insulation and heat flux spreader layers 132 and 134 are then folded at various places to form the enclosure 130. In particular, a fold is made along an edge 130a to form a generally planar first side 130b aligned perpendicularly with a planar bottom side 130c. A fold is made along an edge 130d to form an opposing planar side 130e perpendicular to the bottom side 130c. A fold is made along an edge or hinge 130f at the top edge of the side 130e to form a generally planar lid 130g, where the hinge 130f serves as a hinge for the lid 130g. The lid 130g is folded downwards as indicated by an arrow 136 after the electronic circuitry mounted on the circuit board 100 is placed into the enclosure 130. A fold is made along an edge 130h to form a lip 130i on the lid 130g along the side opposite the hinge 130f, so that the lip 130i aligns adjacent the inside surface of the side 130b when the lid 130g is folded downwards to form the top side of the enclosure 130. The lip 130i provides an overlap with the side 130b to ensure electrical insulation of the circuitry from the heat flux spreader layer 134, as more clearly shown in FIG. 11.

A fold is made along an edge 130j between the side 130e and a first ac end flap 130k, and another fold is made along an edge 130l between the bottom side 130c and a second ac end flap 130m. Corresponding ac end flaps 134a and 134b of the heat flux spreader layer 134 are shown adhesively bonded to corresponding portions of the electrical isolation layer 132 to form the ac end flaps 130k and 130m, respectively, to increase mechanical strength and thermal conductivity. The ac end flaps 130k and 130m are preferably adhesively bonded together after being folded, to form a corner of the box-like enclosure 130 on one side of the ac end. The ac end flap 130k is shorter than the bottom layer 130c is wide to leave an opening 138 to align with and allow external connection to the ac receptacle 102. The side 130e is also folded along an edge 130n to form a dc end 130p of the enclosure 130, where the dc end is opposite the ac end. A fold is made along an edge 130r of the bottom side 130c to form a flap 130q, which aligns on the outside and is bonded to the dc end 130p to provide support. The dc end 130p and the flap 130q are preferably shorter than the bottom side 130c is wide to leave an opening 139 to align with the opening 119, which allows external access to the dc receptacle by the dc cord 180.

A layer of laminating adhesive 143 (FIG. 10), sold under the trademark Stamark by 3M, is preferably included on the external surface of the bottom side 130c to bond with the inner surface of a bottom side 150d of the lower half member 150b. The enclosure 130 includes a cut out hole portion 140a and 140b on opposing corners of the bottom side 130c, which preferably align with the two posts 152. Two circular holes 153 (only one shown) in the circuit board 100 align with the posts 152 and with the openings 140a and 140b, so that the posts 152 protrude through the openings 140a and 140b into the corresponding holes 153. Further, each post 152 includes a shorter collar 154 formed at its base having a greater diameter than the posts 152 and the holes 153, so that the circuit board 100 rests flush on the collars 154. Furthermore, the lower half member 150b includes two clips 156 (FIG. 11) integrally formed on opposite corners on the bottom side 150d of the lower half member 150b, which align with corresponding holes 140e and 140f provided on the other two opposing corners of the bottom side 130c of the enclosure 130 to allow contact with the circuit board 100 near corresponding corners. In this manner, the clips 156 preferably snap the circuit board 100 in place after being pressed into the lower half member 150b, as more clearly shown in FIG. 11. In this manner, the circuit board 100 is securely fastened to the lower half member 150b to rest on the collars 154.

The enclosure 130 preferably includes three openings 142 (only one shown) and the heat flux spreader layer 134 includes corresponding electrical tabs 144 which protrude into the openings 142 to allow exposure to the circuit board 100. There are three openings 142 and three corresponding tabs 144, although only one is shown in FIG. 8 for purposes of convenience. Three corresponding screws 164 (only two shown) align with three corresponding holes (not shown) drilled at grounding locations in the circuit board 100, so that the screws 164 are screwed through the circuit board 100 at the grounding locations and through the tabs The lower half member 150b includes three corresponding threaded bosses 162 (only two shown) to receive the screws 164. A pad of solder (not shown) is electrically grounded to and is provided around each grounding location hole to contact the corresponding tabs 144. The screws 164 serve to provide grounding locations from the electronic circuit of the ac to dc converter C to ground the heat flux spreader layer 60 to a common ground of the electronic circuit. In this manner, the heat flux spreader layer 134 also forms an effective EMI shield for the electronic circuit, which generates significant EMI radiation due to the AC voltages and the relatively high amount of power being converted. Nonetheless, the grounding locations are not necessary for thermal consideration alone. This also provides greater electrical safety by reducing the possibility shock to the user.

Once the screws 164 are screwed in place, the lid 130g is folded in the direction of the arrow 136 to enclose the electrical circuitry, where the lip 130i folds to the inside of the side 130b so that the edge 130h aligns with an upper edge 130s of the side 130b. The heat flux spreader layer 134 includes an extended flap 134c which extends above the edge 130 and which folds along the edge 130s in the direction of an arrow 141 to contact the top side of the lid 130g. The flap 134c preferably folds to contact the portion of the heat flux spreader layer 134 extending on the top side of the lid 130g. Adhesive bonding, such as #9471 by 3M, is preferably provided to bond the flap 134c to the lid 130g. In this manner, the electrical insulation layer 132 forms a generally continuous inner layer, and the heat flux spreader layer forms a generally continuous outer layer of the enclosure 130.

The two posts 170 are aligned with corresponding openings 140c and 140d provided on opposite corners of the lid 130g, so that the posts 170 protrude into the openings 140c and 140d and align with the two corresponding posts 152. The opening 138 provided in the enclosure 130 aligns with an opening 158 provided on the lower half member 150b and with an opening 178 provided on the upper half member 150a of the enclosure 150 to allow external connection of an ac cord to the ac receptacle 102. In like manner, the opening 139 aligns with a lower U-shaped opening 160 formed in the lower half member 150b, which further aligns with an upper U-shaped opening 180 in the upper half member 150a of the enclosure 150, to allow external connection to the dc receptacle.

The final assembled ac to dc converter C is shown in FIG. 9, which shows the ac receptacle 102 provided externally on the ac end and the dc cord 180 provided to connect to the dc receptacle on the dc end.

Referring now to FIG. 10, a cross-sectional side view of the ac to dc converter C is shown looking along lines 10—10 of FIG. 9. The heat flux spreader layer 134 and the electrical insulation layer 132 of the enclosure 130 are shown generally surrounding the electrical circuitry. The heat fin members 112c and 118e are shown aligned parallel with and opposing a portion of a top side 150c of the enclosure 150 and the heat flux spreader layer 134 forming the outer layer of the lid 130g. The fastening heat fin member 118a aligns parallel with and opposes a portion of the dc end 130p and with a corresponding dc end 150g of the enclosure 150. FIG. 10 also shows the electrical tab members 144 from the heat flux spreader layer 134 provided to contact the circuit board 100 at the threaded bosses 162.

Referring now to FIG. 11, a cross-sectional end view of the ac to dc converter C is shown looking along lines 11—11 of FIG. 10. The fastening member 112a is shown aligned parallel with and opposing a portion of a side 150f of the enclosure 150.

The advantage and function of the electrical insulation layer 132 can now be appreciated with reference to FIGS. 8–11. The ac to dc converter C preferably converts approximately 35 watts of usable power provided to the dc receptacle at an efficiency of approximately 82–87%, so that approximately 5–8 watts of power is converted into thermal energy which must be dissipated. Since the volume of the enclosure 150 is approximately 23.3 in$^3$, the dissipated power density of the ac to dc converter C is approximately 322 mW/in$^3$ if 7.5 watts of power is being dissipated. Given the power and efficiency as well as the size of the ac to dc converter C, the heat flux spreader layer 134 is desirable to spread the internal heat flux radiated and convected from the heat sinks 112 and 118 across a substantial portion of the surface area of the walls of the enclosure 150. However, the heat flux spreader layer 134 exhibits very high electrical conductivity as well as high thermal conductivity, significantly increasing the risk of electrical short causing malfunction if any electrical components contact the heat flux spreader layer 134. This further increases the risk of electrical shock to the user. To ensure proper operation and to prevent electrical shock, the electrical insulation layer 132 electrically isolates the electrical circuitry mounted on the circuit board 100 from the heat flux spreader layer 134.

The electrical insulation layer 132 is significantly thinner than an equivalent air gap necessary to meet spacing requirements, and is effectively transparent to radiant heat transfer. The heat sink members 112a, 112c, 118a, 118e and 118g are aligned parallel with and may even contact the inner surface of the electrical insulation layer 132 without risk of shorting the electrical circuitry to the heat flux spreader layer 134. Due to the thickness of the electrical insulation layer 132, the various members of the heat sinks 112 and 118 are preferably located in relatively close proximity to the heat flux spreader layer 134 as shown in FIGS. 10 and 11, which allows improved dissipated power density of the ac to dc converter C. Further, the reduction in size allows a smaller ac to dc converter C compared to prior art units having equivalent power and efficiency ratings due to the increased dissipated power density.

The foregoing disclosure and description of the invention are illustrative and explanatory thereof, and various changes in the size, shape, materials, components, circuit elements, wiring connections and contacts, as well as in the details of the illustrated circuitry and construction may be made without departing from the spirit of the invention.

I claim:

1. A natural convection cooled electronic device, comprising:
   - at least one electrical component producing heat;
   - a heat conductive enclosure comprising an organic polymeric composition, said heat conductive enclosure having an inner cavity with a resulting inner surface, wherein said heat conductive enclosure surrounds said electrical component without contacting said electrical component;
   - at least one heat sink including a member for fastening to said electrical component and at least one heat fin member integrally joined to said fastening member, said heat fin member being aligned close to, parallel with and opposing a portion of said inner surface, said fastening member having an outer edge, said heat fin member joined to said fastening member at a portion of said outer edge, said heat sink being without a heat fin member at other than said outer edge of said fastening member;
   - means to fasten said electrical component to said heat sink fastening member for providing good thermal contact between said electrical component and said heat sink;
   - means for mounting said electrical component and said heat sink within said heat conductive enclosure; and
   - a layer of electrically insulating plastic for electrically insulating said heat fin member from said inner surface.

2. The device of claim 1, further, comprising:
   - a layer of heat conductive material lining a substantial portion of said inner surface of said heat conductive enclosure, wherein said electrically insulating means electrically insulates said heat sink from said layer of heat conductive material.

3. The device of claim 2, wherein said layer of heat conductive material comprises a sheet of aluminum foil.

4. The device of claim 2, wherein said layer of electrically insulative plastic is adhesively bonded to said layer of heat conductive material, wherein said bonded layers are folded to form an inner enclosure surrounding said electrical component and said heat sink, said inner enclosure being located within said inner cavity of said heat conductive enclosure.

5. The device of claim 1, wherein said layer of electrically insulative plastic comprises a flexible sheet of electrically insulative plastic material.

6. The device of claim 5, wherein said flexible sheet of electrically insulative plastic material comprises a sheet of polycarbonate resin.

7. The device of claim 1, wherein said inner surface of said heat conductive enclosure forming said cavity and said heat fin member of said heat sink are generally planar.

8. The device of claim I, wherein said organic polymeric composition comprises a thermoplastic polyester.

9. The device of claim 1, wherein said heat sink is formed of aluminum and colored black.

10. A natural convection cooled electronic device, comprising:
    - a circuit board for receiving electrical components;
    - at least one electrical component producing heat and connected to said circuit board;
    - a heat conductive enclosure comprising an organic polymeric composition, said heat conductive enclosure having an inner cavity with a resulting inner surface, wherein said heat conductive enclosure surrounds said circuit board and said electrical component;
    - at least one heat sink including a member for fastening to said electrical component and at least one heat fin member integrally joined to said fastening member, said heat fin member being aligned close to, parallel with and opposing a portion of said inner surface, said fastening member having an outer edge, said heat fin member joined to said fastening member at a portion of said outer edge, said heat sink being without a heat fin member at other than said outer edge of said fastening member;
    - means to fasten said electrical component to said heat sink fastening member for providing good thermal contact between said electrical component and said heat sink;
    - means for mounting said circuit board within said heat conductive enclosure; and
    - a layer of electrically insulative plastic for electrically insulating said heat fin member from said inner surface.

11. The device of claim 10, wherein said inner surface of said heat conductive enclosure forming said cavity and said heat fin member of said heat sink are generally planar.

12. The device of claim 10, wherein said organic polymeric composition comprises a thermoplastic polyester.

13. The device of claim 10, wherein said heat sink is formed of aluminum and colored black.

14. The device of claim 10, further comprising:
    - a flexible sheet of heat conductive material with a first side and a second side, wherein said heat conductive sheet is formed to provide a lining for a portion of said inner surface, said first side facing and being aligned next to said inner surface, and said second side being aligned next to said electrically insulating means.

15. The device of claim 14, wherein said heat conductive sheet comprises a sheet of aluminum foil.

16. The device of claim 14, wherein said layer of electrically insulative plastic is adhesively bonded to said second side of said heat conductive sheet, wherein said electrically insulative plastic layer and said heat conductive sheet form an inner enclosure surrounding said circuit board, said electrical component and said heat sink, and wherein said inner enclosure is placed within said inner cavity of said heat conductive enclosure.

17. The device of claim 10, wherein said layer of electrically insulative plastic comprises a sheet of polycarbonate resin.

18. A natural convection cooled electronic device, comprising:

at least one electrical component producing heat;

a heat conductive enclosure having an inner cavity with a resulting inner surface, wherein said heat conductive enclosure surrounds without contacting said electrical component;

at least one heat sink including a member for fastening to said electrical component and at least one heat fin member integrally joined to said fastening member, said heat fin member being aligned close to, parallel with and opposing a portion of said inner surface;

means for fastening said electrical component to said heat sink fastening member for providing good thermal contact between said electrical component and said heat sink;

means for mounting said electrical component and said heat sink within said heat conductive enclosure;

a layer of heat conductive material lining a substantial portion of said inner surface of said heat conductive enclosure; and a flexible sheet of electrically insulative plastic for electrically insulating said heat fin member from said layer of heat conductive material.

19. The device of claim 18, wherein said flexible sheet of electrically insulative plastic is adhesively bonded to said layer of heat conductive material, wherein said bonded layers are folded to form an inner enclosure surrounding said electrical component and said heat sink, said inner enclosure being located within said inner cavity of said heat conductive enclosure.

20. The device of claim 19, wherein said flexible sheet of electrically insulative plastic comprises a sheet of polycarbonate resin.

21. The device of claim 18, wherein said layer of heat conductive material comprises a sheet of aluminum foil.

22. The device of claim 18, wherein said inner surface of said heat conductive enclosure forming said cavity and said heat fin member of said heat sink is generally planar.

23. The device of claim 18, wherein said heat conductive enclosure comprises a thermoplastic polyester.

24. The device of claim 18, wherein said heat sink is formed of aluminum and colored black.

* * * * *

UNITED STATES PATENT AND TRADEMARK OFFICE
CERTIFICATE OF CORRECTION

PATENT NO.    : 5,258,888
DATED         : NOV. 2, 1993
INVENTOR(S)   : GEORGE K. KORINSKY

It is certified that error appears in the above-identified patent and that said Letters Patent is hereby corrected as shown below:

In col 20, line 18, please replace "I" with --1--.

Signed and Sealed this

Fifth Day of April, 1994

*Attest:*

BRUCE LEHMAN

*Attesting Officer*    Commissioner of Patents and Trademarks